United States Patent
Park (10) Patent No.: US 6,259,628 B1
(45) Date of Patent: Jul. 10, 2001

(54) MEMORY DEVICES WITH VERIFYING INPUT/OUTPUT BUFFER CIRCUITS AND METHODS OF OPERATION THEREOF

(75) Inventor: Jong-Min Park, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/216,189

(22) Filed: Dec. 18, 1998

(30) Foreign Application Priority Data

Dec. 30, 1997 (KR) .................................................. 97-79449

(51) Int. Cl.$^7$ .................................................. G11C 16/06
(52) U.S. Cl. ................ 365/185.22; 305/185.21; 305/185.33
(58) Field of Search .................. 365/185.22, 185.21, 365/185.33

(56) References Cited

U.S. PATENT DOCUMENTS 5,784,317 * 7/1998 Ha .................................... 365/185.22
5,886,927 * 3/1999 Takeuchi ......................... 365/185.22

* cited by examiner

Primary Examiner—Richard Elms
Assistant Examiner—Van Thu Nguyen
(74) Attorney, Agent, or Firm—Myers Bigel Sibley & Sajovec

(57) ABSTRACT

The disclosure is a nonvolatile semiconductor memory having a plurality of memory cells, the memory cells being programmed and erased. The memory comprises a memory cell array having the memory cells arranged in a matrix, a sense amplifier for detecting a state of the memory cell, an input/output buffer for receiving an output of the sense amplifier and for generating an output responding to the output of the sense amplifier, a verifying circuit for generating an output responding to the output of the input/output buffer, and a control logic block for receiving signals relevant to verifying operations after programming and erasing and for generating signals controlling the input/output buffer and verifying circuit. The verifying operations for programmed and erased cells are conductive through the sense amplifier, the input/output buffer and verifying circuit, in common.

31 Claims, 5 Drawing Sheets

MEMORY DEVICES WITH VERIFYING INPUT/OUTPUT BUFFER CIRCUITS AND METHODS OF OPERATION THEREOF

FIELD OF THE INVENTION

The present invention relates to nonvolatile semiconductor memory devices, and more particularly to nonvolatile memories with verifying functions for programming and erasing and the method thereof.

BACKGROUND OF THE INVENTION

Flash memories have advanced performances in accessing data, than any other kind of nonvolatile memories such as electrically erasable and programmable read only memories, for a reading and writing (or programming). The merit of high speed operation in the flash memory has been regarded to be very adaptable to portable computing apparatuses, cellular phones or digital still cameras. In general, there are two kinds of the flash memory, such as the NAND-type in which memory cells are connected from a bit line in serial, and the NOR-type in which memory cells are connected to a bit line in parallel. It is well known that the NOR-type flash memory has a competitive speed for data accessing, which makes the NOR-type be more advantageous in a high frequency memory system than the NAND-type.

Figure 1:
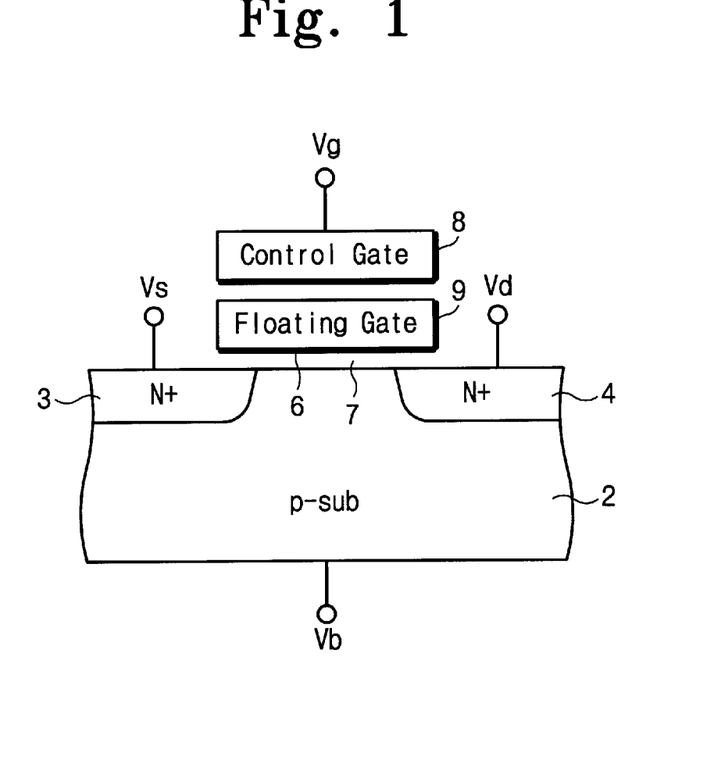
FIG. 1 shows a vertical structure of a flash electrically erasable and programmable memory cell.

Typical construction of the cell (or cell transistor) of the flash memory is shown in FIG. 1, which can be used for the multi-bit storage. Source 3 and drain 4, each being formed of N+ diffused region in P+ semiconductor substrate 2, are separated each other through a channel region which is also defined in substrate 2. Floating gate 6 is formed over the channel region through thin insulating film 7 which is under 100 Å, and insulating film 9, such as an O—N—O (Oxide-Nitride-Oxide) film, on floating gate 6 isolates control gate 8 from floating gate 6. Source 3, drain 4, control gate 8 and substrate 2 are each connected to their corresponding voltage sources Vs (drain voltage), Vd (source voltage), Vg (gate voltage) and Vb (bulk voltage), for programming, erasing and reading operations.

In programming, as well known, a selected memory cell is programmed by means of a hot electron injection between the channel region and floating gate, in which the source and substrate are held in a ground voltage, a high voltage (e.g., Vg=10 V) is applied to the control gate and a voltage to induce the hot electrons therein, 5 V through 6 V, is provided to the drain. After programmed, a threshold voltage of the selected memory cell is increased therefrom due to deposition of electrons. To read data from the programmed cell, a voltage of about 1 V is applied to the drain, a power source voltage (or about 4.5 V) is applied to the control gate, and the source is held in the ground voltage. Since the increased threshold voltage of the programmed memory cell acts as an blocking potential even upon the gate voltage during a read-out operation, the programmed cell is considered to as an off-cell which has a threshold voltage between 6 V and 7 V.

Erasing a memory cell is accomplished by conducting F-N (Fowler-Nordheim) tunneling effect, in which the control gate is coupled to a high negative voltage of about −10 V, and the substrate (or bulk) to a positive voltage of about 5 V, in order to induce the tunneling therebetween. While this, the drain is conditioned at a high impedance state (or a floating state). A strong electric field induced by the voltage bias conditions, between the control gate and bulk region, causes the electrons to be moved into the source. The F-N tunneling normally occurs when the electric field of 6~7 MV/cm is developed between the floating gate and bulk region which are separated through the thin insulating film under 100 Å. The erased cell has a lower threshold voltage than before, and thereby sensed as an on-cell which has a threshold voltage between 1~3 V.

In an usual architecture of a memory cell array in a flash memory, the bulk region (or the substrate) combines active regions of memory cells, so that memory cells formed in the same bulk region are spontaneously erased in the same time. Therefore, units of erasing (hereinafter referred to as "sector", for instance, one sector of 64 K) is determined in accordance with the number of separating the bulk regions. Table 1 shows levels of the voltages used in programming, erasing and reading.

TABLE 1

| operation mode | Vg | Vd | Vs | Vb |
| --- | --- | --- | --- | --- |
| programming | 10V | 5~6V | 0V | 0V |
| erasing | −10V | floating | floating | 5V |
| reading | 4.5V | 1V | 0V | 0V |

Figure 2:
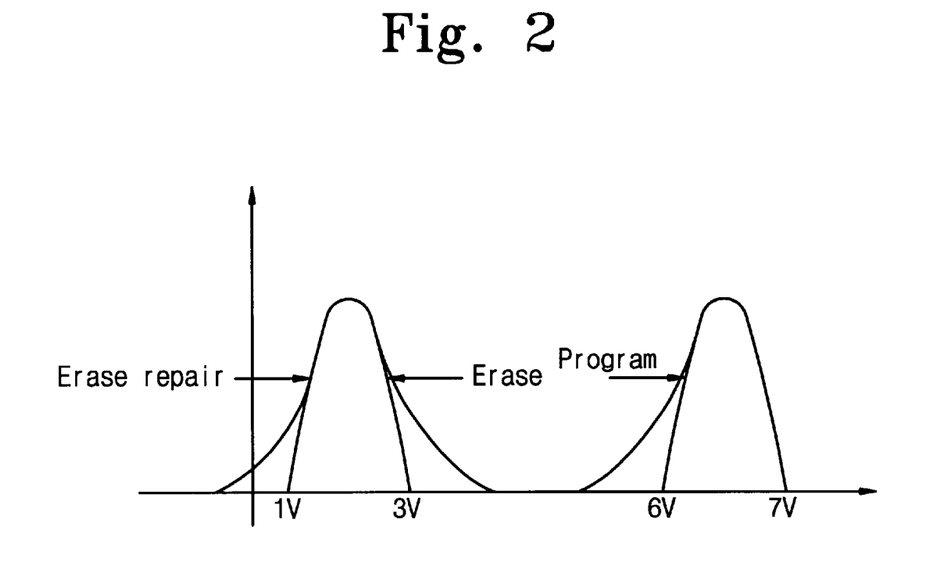
FIG. 2 shows variation of threshold voltages after programming and erasing.

After programming and erasing with the bias conditions shown in Table 1, there is a need of checking the result of the operations. Referring to FIG. 2, threshold voltages of memory cells which experienced the programming are positioned at about 6 through 7 V and erased threshold voltages are adjusted to be 1 V through 3 V. In an erase operation, the first step is to make the highest one of the erased threshold voltages not be over than 3 V (re-erasing for under-erased memory cells), and the second is to forcibly make over-erased threshold voltages under 1 V be shifted up to the 1 V (i.e., erase repairing for over-erased memory cells). Meanwhile, under-programmed threshold voltages under 6 V shall be forced to be shifted up to the 6 V (re-programming for under-programmed memory cells).

Whether or not a further erasing or programming needs is determined by a verifying circuit which detects a status (e.g., on-cell or off-cell) of a selected memory cell. The repairing operations of erasing and programming are each accomplished by their respective verifying processes with respective verifying circuits. Separate circuits for verifying of the programming and erasing cause the lay-out size to be increased thereof.

SUMMARY OF THE INVENTION

The present invention is intended to solve the problems. And, it is an object of the invention to provide a nonvolatile semiconductor memory device having a single circuit for performing verifying operations for programming and erasing.

In order to accomplish those objects, the memory of the invention includes a memory cell array having the memory cells arranged in a matrix, a sense amplifier for detecting a state of the memory cell, an input/output buffer for receiving an output of the sense amplifier and for generating an output responding to the output of the sense amplifier, a verifying circuit for generating an output responding to the output of the input/output buffer, and a control logic block for receiving signals relevant to verifying operations after programming and erasing and for generating signals controlling the input/output buffer and verifying circuit. The verifying operations for programmed and erased cells are conductive through the sense amplifier, the input/output buffer and verifying circuit, in common.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote like or corresponding parts, and a signal name accompanying prefix "n" operates in negative logic.

DETAILED DESCRIPTION OF THE PREFERRED EMBODIMENTS

Hereinbelow, applicable embodiments of the invention will be as follows, with the appended drawings.

Figure 3:
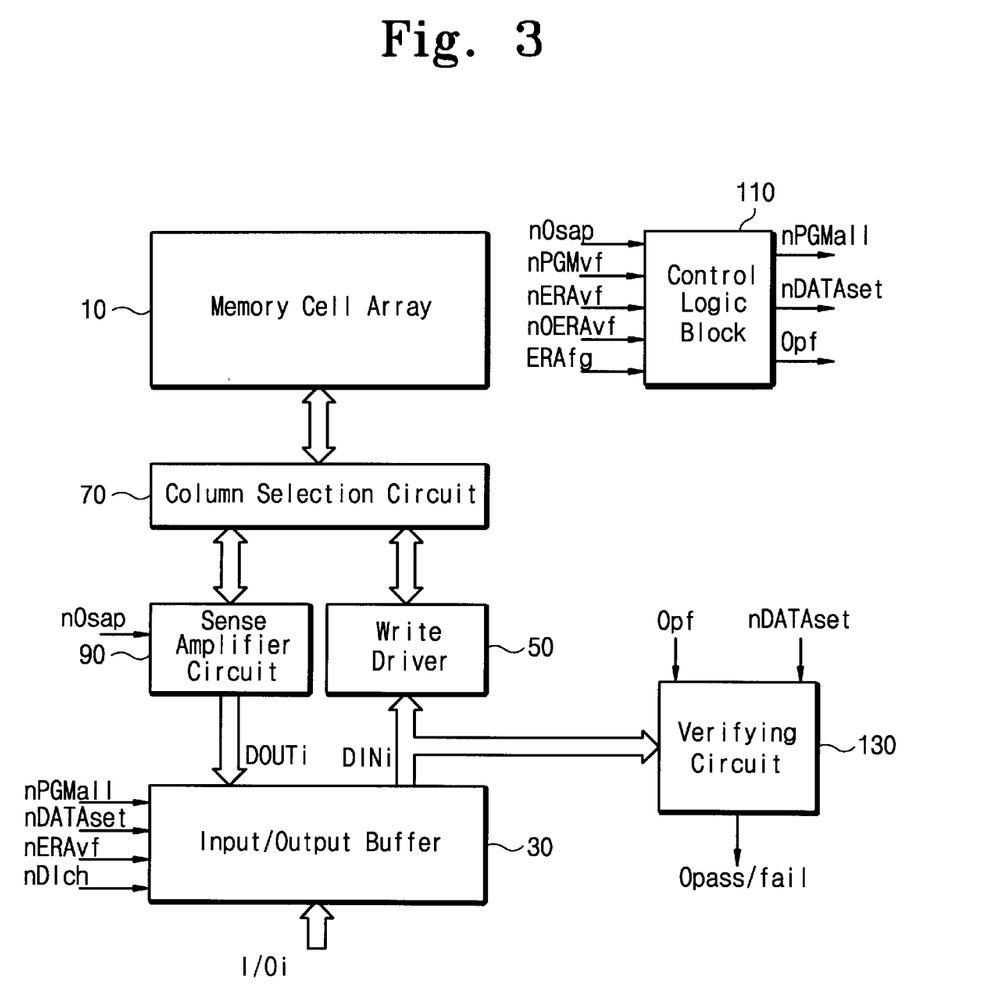
FIG. 3 is a block diagram schematically illustrating a construction of a flash memory device according to the invention.

FIG. 3 illustrates a functional construction of the non-volatile memory device of the invention, including memory cell array 10, input/output buffer 30, write driver 50, column selection circuit 70, sense amplifier circuit 90, control logic block 110 and verifying circuit 130. Referring to FIG. 3, memory cell array 10 is formed of plural memory cells shown in FIG. 1 which are arranged in a matrix of lows and columns, and input/output buffer 30 transfers external data to memory cell array 10 through write driver 50 and column selection circuit 70 and generates output data transferred from memory cell array 10 through column selection circuit 70 and sense amplifier circuit 90. Write driver 50 receives input data from input/output buffer 30 and puts them into memory cell array 10, and column selection circuit 70 connects bit lines of memory cell array 10 to sense amplifier circuit 90 in a data-out state or to write driver 50 in a data-in state. Sense amplifier circuit 90 detects and amplifies data read out from memory cell array 10. Control logic block 110 receives verifying control signals nOsap, nPGMvf, nERAvf, nOERAvf and ERAfg and generates signals for verifying after programming and erasing, nPGMall, nDATset and Opf which are applied to input/output buffer 30 and verifying circuit 130. Verifying circuit 130 receives data from input/output buffer 30 and generates signal Opass/fail informing a status of a selected memory cell, "pass" or "fail", in response to verifying signals nPGMall, nDATAset and Opf.

Figure 4:
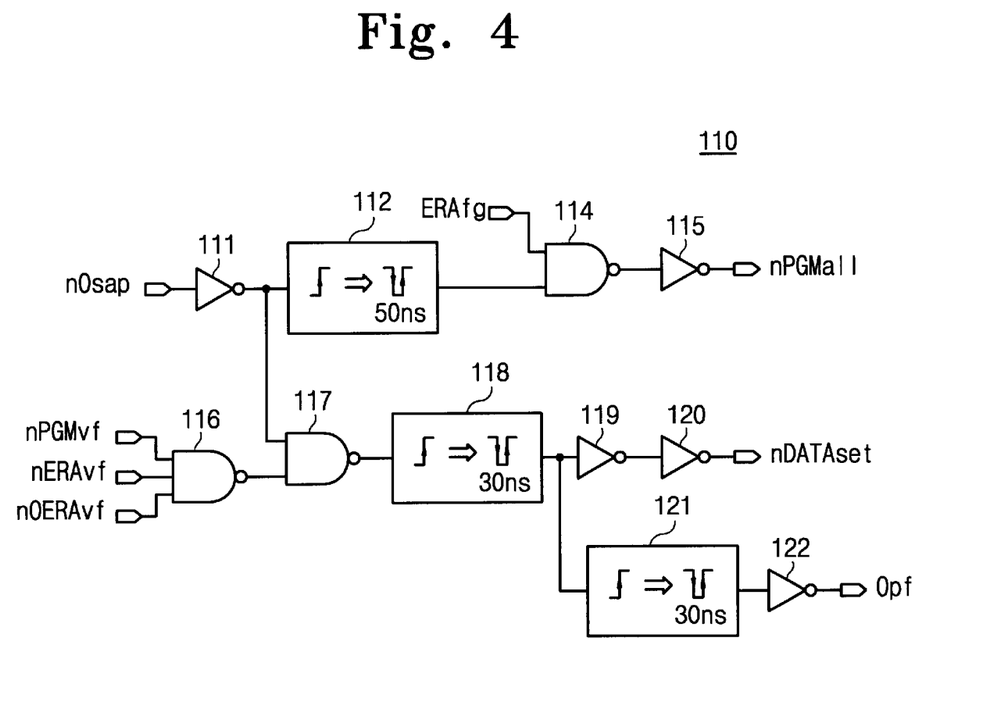
FIG. 4 is a schematic illustrating a control logic circuit of FIG. 3.

Control logic block 110 is disclosed in FIG. 4, including pulse generators 112, 118 and 121 so as to establish activation periods of its output signals nPGMall, nDATAset and Opf. Output of inverter 111 which receives sensing control signal nOsap is applied to pulse generator 112. Output of pulse generator 112 is applied to NAND gate 114 which receives signal ERAfg, and nPGMall, a signal for initiating the input/output buffer, is generated through inverter 115 from the output of NAND gate 114. Pulse generator 112 creates a pulse of low level lasting 50 ns in response to a transition of signal nOsap that falls down to low level from high level. nPGMall is held at high level as a disable state when the pulse generated from generator 112 is laid on low level for the 50 ns (nanosecond). Output of NAND gate 117 is provided to pulse generator 118 which makes a pulse with low level lasting 30 ns in response to the transition of nOsap that goes to low level from high level. The output of pulse generator 118 is connected to input of another pulse generator 121, as well as becoming data setting signal nDATAset through inverters 119 and 120 in sequence. Pulse generator 121 makes a pulse of low level lasting 30 ns in response to when the pulse from generator 118 goes to high level from its effective low level. Output of pulse generator 121 becomes data transmission control signal Opf through inverter 122.

Figure 5:
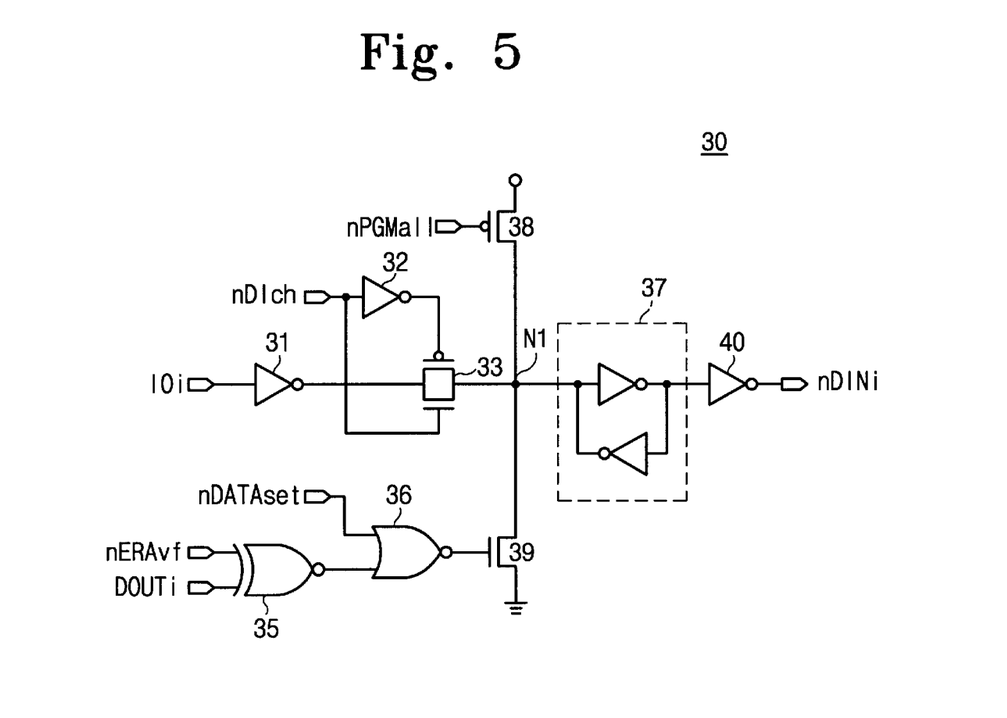
FIG. 5 is a circuit diagram illustrating an input/output buffer of FIG. 3.

FIG. 5 shows the circuit of input/output buffer 30, in which a latch circuit is included. Input/output line IOi is connected to input of latch circuit 37 through inverter 31 and CMOS transfer gate 33. Output of latch circuit 37 is connected to data line nDINi (or an input data bit) through inverter 40. The PMOS gate electrode of transfer gate 33 is coupled to signal nDlch through inverter 32 and the NMOS gate electrode directly to nDlch. To node N1 disposed between the transfer gate 33 and latch circuit 37, drain of PMOS transistor 38, whose source is connected to a power supply voltage, and drain of NMOS transistor 39, whose source is grounded, are connected in common. Gate of transistor 39 receives nPGMall. Output of exclusive-NOR gate 35 receiving nERAvf and DOUTi is applied to input of NOR gate 36 together with nDATAset, and output of NOR gate 36 is applied to gate of NMOS transistor 39. PMOS and NMOS transistors, 38 and 38, are to initialize latch circuit 37. Latch circuit 37 stores program data in a program mode and holds verifying data in a verifying mode.

Figure 6:
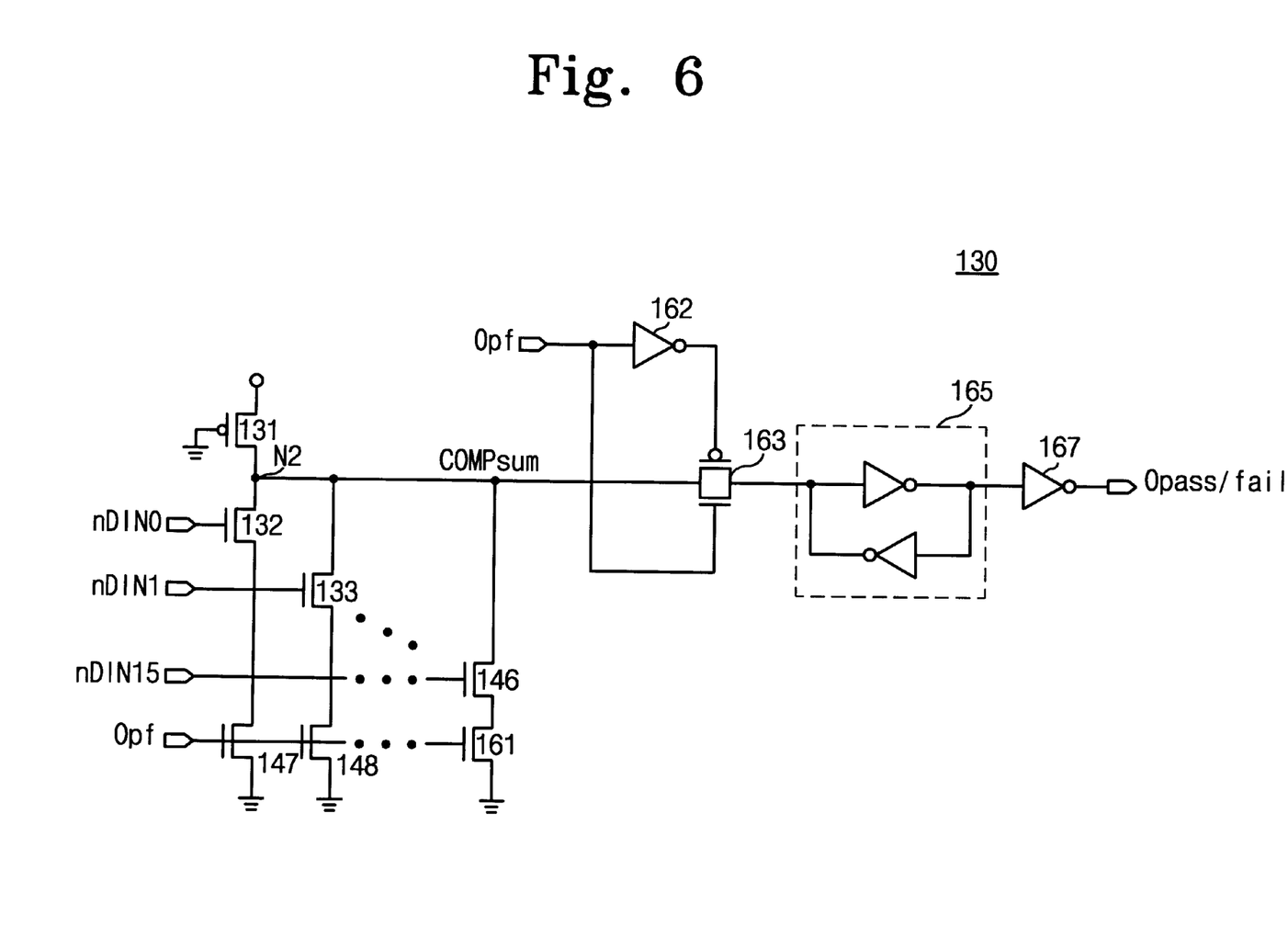
FIG. 6 is a circuit diagram illustrating a verifying circuit 130 of FIG. 3.

Verifying circuit 130, referring to FIG. 6, includes plural NMOS transistors 132 through 146 (e.g., 16 transistors) gates of which are coupled to plural input data bits nDIN0 through nDIN15. Each of sources of NMOS transistors 132 to 146 are connected to the ground through each of NMOS transistors 147 to 161, and drains of the NMOS transistors are connected to verify sensing node COMPsum in common. Between node COMPsum and the power supply voltage PMOS transistor whose gate is grounded is connected. Node COMPsum is connected to latch circuit 165, whose output becomes signal Opass/fail after passing through inverter 167, through transfer gate 163 controlled by verifying control signal Opf. Opass/fail determines a result of verifying (either the program verifying or the erase verifying), i.e., pass or fail.

In a program mode, data to be written in memory cells are supplied from input/output buffer 30 and then stored in the latch circuits 37. And the data stored in the latch circuits are applied to selected memory cells through write driver 50. A selected memory cell to be programmed becomes an off-cell that contains charges in its floating gate, corresponding to logic "0". In an erase mode, an erased memory cell is referred to as an on-cell that corresponds to logic "1". Now, hereinafter, an explanation for the verifying operations each after the programming and erasing will be described.

Figure 7:
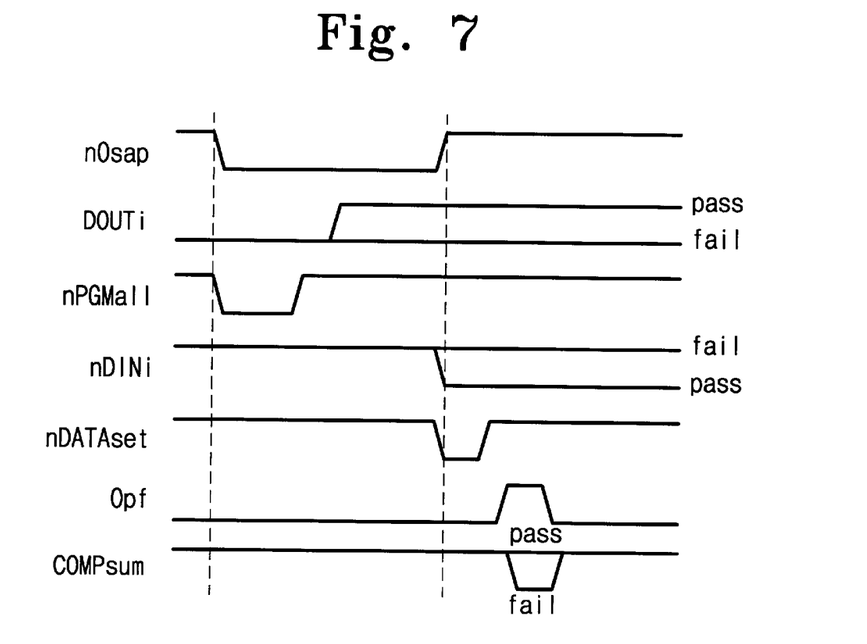
FIG. 7 is a timing diagram of program-verifying according to the invention.

Referring to FIG. 7, after programming, data DOUTi are read out from programmed memory cells in response to activation of nOsap which goes to low level. A data bit DOUTi becomes logic "0" or "1" each when the programmed memory cell is an off-cell or an on-cell. Responding to the activation of Osap, pulse generator 112 of control logic block 110 makes nPGMall with a short pulse lasting low level during about 50 ns, and thereby latch circuit 37 is preset into logic "1". The substantial program verifying operation starts when nOsap goes to high level, and then DATAset of low level and Opf of high level, each with a short pulse lasting about 30 ns, are created from control logic block 110. In input/output buffer 30, transfer gate 33 is shut down to prevent external data being input thereto, and DOUTi read out from a selected memory cell through sense amplifier 90 is applied to the input of XNOR gate 35. Erase verify signal nERAvf is held in high level while the program verifying operation is being carried out. Assuming that the DOUTi applied to the input of XNOR gate 35 is logic "0" that corresponds to the off-cell, the output of XNOR gate 35 is low level and the output of NOR gate 36 becomes low level during nDATAset maintains the low short pulse. As NMOS transistor 39 is turned on, node N1 of latch circuit 37 changes to logic "0" from the pre-set logic "1". As a result, final output nDINi becomes logic "0" that designates the selected memory cell is programmed. The nDINi of logic "0" output from input/output buffer 30 is applied to one of gates of NMOS transistors 132 through 146. NMOS transistors 147 through all connected to the ground terminal are turned on by nOsap of high level. Since the selected nDINi (one of nDIN0 through nDIN15) is logic "0", COMPsum maintains high level and thereby the programmed state of the selected memory cell is determined to as "pass".

On the other hand, if DOUTi read out from a programmed memory cell is detected to as logic "1" and that is applied to the input of XNOR gate 35, the state of latch circuit 37, node N1, can not be changed from the pre-set logic "1". Thus, DINi at this case becomes logic "1" and COMPsum set into low level that means the selected memory cell is not successfully programmed, i.e., "fail".

Figure 8:
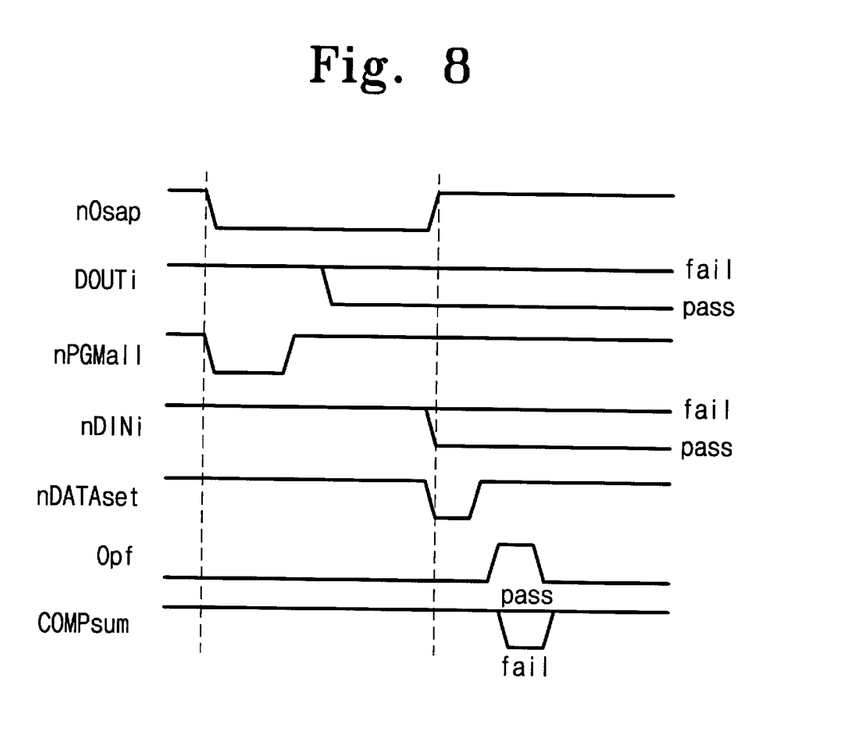
FIG. 8 is a timing diagram of erase-verifying according to the invention.

Referring to FIG. 8, after erasing memory cells in which memory cells erased are rendered to be on-cells, data DOUTi are read out from erased memory cells in response to activation of nOsap which goes to low level. A data bit DOUTi becomes logic "1" or "0" each when the erased memory cell is an on-cell or an off-cell. Responding to the activation of Osap, pulse generator 112 of control logic block 110 makes nPGMall with a short pulse lasting low level during about 50 ns, and thereby latch circuit 37 is preset into logic "1". The substantial erase verifying operation starts when nOsap goes to high level, and then DATAset of low level and Opf of high level, each with a short pulse lasting about 30 ns, are created from control logic block 110. In input/output buffer 30, transfer gate 33 is shut down to prevent external data being input thereto, and DOUTi read out from a selected memory cell through sense amplifier 90 is applied to the input of XNOR gate 35. Erase verify signal nERAvf is held in low level while the erase verifying operation is being carried out. Assuming that the DOUTi applied to the input of XNOR gate 35 is logic "1" that corresponds to the on-cell, the output of XNOR gate 35 is low level and the output of NOR gate 36 becomes low level during nDATAset maintains the low short pulse. As NMOS transistor 39 is turned on, node N1 of latch circuit 37 changes to logic "0" from the pre-set logic "1". As a result, final output nDINi becomes logic "0" that designates the selected memory cell is programmed. The nDINi of logic "0" output from input/output buffer 30 is applied to one of gates of NMOS transistors 132 through 146. NMOS transistors 147 through all connected to the ground terminal are turned on by nOsap of high level. Since the selected nDINi (one of nDIN0 through nDIN15) is logic "0", COMPsum maintains high level and thereby the erased state of the selected memory cell is determined to as "pass".

On the other hand, if DOUTi read out from an erased memory cell is detected to as logic "0" and that is applied to the input of XNOR gate 35, the state of latch circuit 37, node N1, can not be changed from the pre-set logic "1". Thus, DINi at this case becomes logic "1" and COMPsum set into low level that means the selected memory cell is not successfully erased, i.e., "fail".

As shown above, the verifying operations after programming and erasing are conductive in a unit of circuits, in common, including the logic circuit block 110, input/output buffer 30 and verifying circuit 130. Latch circuits 37 and 165, respectively of the input/output buffer and verifying circuit, are used in determining the logical variation of data detected from the selected memory cell. Therefore, constructing circuits for verifying programmed and erased cells becomes unified and simplified thereby.

Although embodiment of the invention have been disclosed and described, it will be appreciate that other embodiments and modification of the invention are possible.

What is claimed is:

1. A memory device, comprising:
   a memory cell array including a plurality of memory cells;
   a sense amplifier circuit, coupled to the memory cell array, that senses states of memory cells of the memory cell array and responsively produces data output signals on a data output line coupled thereto;
   a write driver circuit, coupled to the memory cell array, that controls states of memory cells of the memory cell array responsive to data input signals on a data input line coupled thereto; and
   a verifying input/output buffer circuit, coupled to the data output line, the data input line and a data input/output line, that produces a data input signal on the data input line responsive to an input signal on an input/output line when the verifying input/output buffer circuit is in a first mode and that produces a verification indication signal on the data input line based on an output signal on the data output line when the verifying input/output buffer circuit is in a second mode.

2. A device according to claim 1, wherein the verifying input/output buffer circuit changes between the first and second modes responsive to a latch control signal.

3. A device according to claim 2, wherein the verifying input/output buffer circuit produces the verification indication signal on the data input line in the second mode responsive to a logical combination of the output signal on the data output line and a verification reference signal applied to the verifying input/output buffer circuit.

4. A device according to claim 3, wherein the verifying input/output buffer circuit comprises:
   a latch circuit that drives the data input line responsive to a signal at an input of the latch circuit;
   a transmission gate that couples and decouples the input/output line and the input of the latch circuit responsive to the latch control signal; and
   a control circuit that drives the input of the latch circuit to one of a first state and a second state based on logical combination of the output signal on the data output line and the verification reference signal when the input/output line and the input of the latch circuit are decoupled.

5. A device according to claim 4, wherein the verifying input/output buffer circuit produces a first logical state in the verification indication signal when the verification reference signal and the output signal on the data output line have a first logical relationship, and wherein the verifying input/ output buffer circuit produces a second logical state in the verification indication signal when the verification reference signal and the output signal on the output data line have a second logical relationship.

6. A device according to claim 5, wherein the verifying input/output buffer circuit produces a first logical state in the verification indication signal when the verification reference signal and the output signal on the data output line have the same logical state, and wherein the verifying input/output buffer circuit produces a second logical state in the verification indication signal when the verification reference signal and the output signal on the output data line have different logical states.

7. A device according to claim 1, wherein the verifying input/output buffer circuit produces the verification indication signal on the data input line in the second mode responsive to a logical combination of the output signal on the data output line and a verification reference signal applied to the verifying input/output buffer circuit.

8. A device according to claim 1:
wherein the data output line comprises a plurality of data output lines;
wherein the data input line comprises a plurality of data input lines;
wherein the verifying input/output buffer circuit produces respective ones of a plurality of verification indication signals on respective ones of the plurality of data input lines based on respective output signals on respective ones of the plurality of data output lines when the verifying input/output buffer circuit is in the second mode; and
wherein the device further comprises a composite verification indication signal generating circuit that produces a composite verification indication signal from the plurality of verification indication signals.

9. The memory device of claim 1, wherein the first mode is a program mode and wherein the second mode is a program verify mode.

10. The memory device of claim 1, wherein the first mode is an erase mode and wherein the second mode is an erase verify mode.

11. A verifying output buffer, comprising:
a data input port;
a data output port;
a data input/output port;
a buffer circuit connected between the data input/output port and the data output port, the buffer circuit including a latch circuit having an output coupled to the data output port and a transmission gate that couples and decouples the data input/output port and an input of the latch circuit in respective first and second modes; and
a control circuit, coupled to the data input port and the input of the latch circuit and configured to receive a reference signal, that drives a signal at the data output port to one of a first state and a second state based on logical combination of a signal applied to the data input port and the reference signal when the transmission gate is in the second mode.

12. A buffer according to claim 11, wherein the transmission gate changes between the first and second modes responsive to a latch control signal applied to the transmission gate.

13. A buffer according to claim 11, wherein the control circuit produces a first logical state in the output signal produced at the data output port when the reference signal and the signal applied to the data input port have a first logical relationship, and wherein the control circuit produces a second logical state in the output signal produced at the data output port when the reference signal and the signal applied to the data input port have a second logical relationship.

14. A buffer according to claim 13, wherein the control circuit produces a first logical state in the output signal produced at the data output port when the reference signal and the signal applied to the data input port have the same logical state, and wherein the control circuit produces a second logical state in the output signal produced at the data output port when the reference signal and the signal applied to the data input port have different logical states.

15. The verifying output buffer of claim 11, wherein the first mode is a program mode and wherein the second mode is a program verify mode.

16. The verifying output buffer of claim 11, wherein the first mode is an erase mode and wherein the second mode is an erase verify mode.

17. A method of operating a memory device including a memory cell array including a plurality of memory cells, a sense amplifier circuit coupled between the memory cell array and a data output line, and a write driver circuit coupled between the memory cell array and a data input line, the method comprising:
coupling the data input line to a data input/output line such that the data input line is driven responsive to a signal applied to the data input/output line; and
decoupling the data input line from the data input/output line while driving the data input line responsive to a logical combination of a signal on the data output line and a reference signal.

18. A method according to claim 17:
wherein the step of coupling the data input line to a data input/output line comprises coupling the data input line to the data input/output line responsive to a first state in a mode control signal; and
wherein the step of decoupling the data input line from the data input/output line while driving the data input line responsive to a logical combination of a signal on the data output line and a reference signal comprises decoupling the data input line from the data input/output line responsive to a second state in the mode control signal while driving the data input line responsive to a logical combination of the signal on the data output line and the reference signal.

19. A method according to claim 17, wherein the step of decoupling the data input line from the data input/output line while driving the data input line responsive to a logical combination of a signal on the data output line and a reference signal comprises producing one of a first logical state or a second logical state in a signal on the data input line based on whether the reference signal and the signal on the data output line have a first logical relationship or a second logical relationship.

20. A method according to claim 17, wherein the step of decoupling the data input line from the data input/output line while driving the data input line responsive to a logical combination of a signal on the data output line and a reference signal comprises producing one of a first logical state or a second logical state in a signal on the data input line based on whether the reference signal and the signal on the data output line have the same logical state or different logical states.

21. A method according to claim 17:
wherein the data output line comprises a plurality of data output lines;

wherein the data input line comprises a plurality of data input lines;

wherein the data input/output line comprises a plurality of data input/output lines; and wherein the step of decoupling the data input line from the data input/output line while driving the data input line responsive to a logical combination of a signal on the data output line and a reference signal comprises decoupling the plurality of data input lines from the plurality of data input/output lines while producing respective ones of a plurality of verification indication signals on respective ones of the plurality of data input lines responsive to respective logical combinations of the reference signal with respective ones of a plurality of signals on the plurality of data output lines; and wherein the method further comprises producing a composite verification indication signal from the plurality of verification indication signals.

22. The method of claim 17:

wherein the step of coupling the data input line to a data input/output line such that the data input line is driven responsive to a signal applied to the data input/output line comprises the step of coupling the data input line to the data input/output line in a program mode; and wherein the step of decoupling the data input line from the data input/output line while driving the data input line responsive to a logical combination of a signal on the data output line and a reference signal comprises decoupling the data input line from the data input/output line while driving the data input line responsive to the logical combination of a signal on the data output line and the reference signal in a program verify mode.

23. The method of claim 17:

wherein the step of coupling the data input line to a data input/output line such that the data input line is driven responsive to a signal applied to the data input/output line comprises the step of coupling the data input line to the data input/output line in an erase mode; and wherein the step of decoupling the data input line from the data input/output line while driving the data input line responsive to a logical combination of a signal on the data output line and a reference signal comprises decoupling the data input line from the data input/output line while driving the data input line responsive to the logical combination of a signal on the data output line and the reference signal in an erase verify mode.

24. A nonvolatile semiconductor memory, comprising:

a memory cell array having a plurality of memory cells arranged in a matrix;

a sense amplifier for detecting a state of a memory cell;

an input/output buffer for receiving an output of the sense amplifier and an input on an input/output line, for generating an output on a write driver data input line corresponding to the input on the input/output line in a first mode and for generating a verification indication signal on the write driver data input line responsive to the output of the sense amplifier in a second mode;

a verifying circuit for generating an output corresponding to the verification indication signal; and a control logic block for generating signals controlling the input/output buffer and verifying circuit.

25. A nonvolatile semiconductor memory according to claim 24, wherein the input/output buffer controls signal transmission from the sense amplifier to the write driver data input line responsive to a latch control signal.

26. A nonvolatile semiconductor memory according to claim 24, wherein the input/output buffer produces the verification indication signal on the write driver data input line in the second mode responsive to a logical combination of the sense amplifier output and a verification reference signal applied to the input/output buffer.

27. A nonvolatile semiconductor memory according to claim 25, wherein the input/output buffer produces the verification indication signal on the write driver data input line in the second mode responsive to a logical combination of the sense amplifier output and a verification reference signal applied to the input/output buffer.

28. A nonvolatile semiconductor memory according to claim 27, wherein the input/output buffer comprises:

a latch circuit that drives the write driver data input line responsive to a signal at an input of the latch circuit;

a transmission gate that couples and decouples the input/output line and the input of the latch circuit responsive to the latch control signal; and a control circuit that drives the input of the latch circuit to one of a first state and a second state based on a logical combination of the sense amplifier output and the verification reference signal when the input/output line and the input of the latch circuit are decoupled.

29. A nonvolatile semiconductor memory according to claim 28, wherein the input/output buffer produces a first logical state in the verification indication signal when the verification reference signal and the sense amplifier output have a first logical relationship, and wherein the input/output buffer produces a second logical state in the verification indication signal when the verification reference signal and the sense amplifier output have a second logical relationship.

30. A nonvolatile semiconductor memory according to claim 28, wherein the input/output buffer produces a first logical state in the verification indication signal when the verification reference signal and the sense amplifier output have the same logical state, and wherein the input/output buffer produces a second logical state in the verification indication signal when the verification reference signal and the sense amplifier output have different logical states.

31. A nonvolatile semiconductor memory according to claim 24:

wherein the sense amplifier comprises a plurality of sense amplifiers, a respective one of which produces a respective sense amplifier outputs;

wherein the write driver data input line comprises a plurality of write driver data input lines;

wherein the input/output buffer produces respective ones of a plurality of verification indication signals on respective ones of the plurality of write driver data input lines based on respective ones of the sense amplifier outputs when the input/output buffer is in the second mode; and wherein the verifying circuit produces a composite verification indication signal from the plurality of verification indication signals.

* * * * *

UNITED STATES PATENT AND TRADEMARK OFFICE
CERTIFICATE OF CORRECTION

PATENT NO.    : 6,259,628 B1                                         Page 1 of 1
DATED         : July 10, 2001
INVENTOR(S)   : Jong-Min Park It is certified that error appears in the above-identified patent and that said Letters Patent is hereby corrected as shown below:

Column 6,
Line 35, please change "an input/output" to -- the data input/output --.
Lines 41 and 44, please change "A device" to -- The memory device --.
Lines 50 and 63, please change "A device" to -- The memory device --.

Column 7,
Lines 5, 14 and 20 , please change "A device" to -- The memory device --.
Lines 60 and 64, please change "A buffer" to -- The verifying output buffer --.

Column 8,
Line 6, please change "A buffer" to -- The verifying output buffer --.
Lines 33 and 47, please change "A method" to -- The method --.
Lines 56 and 65, please change "A method" to -- The method --.

Column 10,
Lines 1 and 5, please change "A nonvolatile" to -- The nonvolatile --.
Lines 11 and 17, please change "A nonvolatile" to -- The nonvolatile --.
Lines 30, 38 and 46, please change "A nonvolatile" to -- The nonvolatile --.

Signed and Sealed this

Thirteenth Day of May, 2003

JAMES E. ROGAN
*Director of the United States Patent and Trademark Office*